US 7,679,356 B2

(12) United States Patent
Garland et al.

(10) Patent No.: US 7,679,356 B2
(45) Date of Patent: Mar. 16, 2010

(54) DIGITAL MULTIMETER HAVING IMPROVED RECORDING FUNCTIONALITY

(75) Inventors: Anthony C. Garland, Camano Island, WA (US); Bradey David Honsinger, Everett, WA (US); Jeffrey William Meyer, Seattle, WA (US); Joseph Victor Ferrante, Redmond, WA (US); John Michael Gilbert, Seattle, WA (US); Christopher Paul Gloger, Seattle, WA (US); Mathew James Martineau, Seattle, WA (US); Nathaniel Jeremiah Wetzel, Seattle, WA (US); Brian Michael Capoccia, Seattle, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 11/838,879

(22) Filed: Aug. 14, 2007

(65) Prior Publication Data

US 2009/0045799 A1    Feb. 19, 2009

(51) Int. Cl.
*G01R 1/38* (2006.01)
*G01R 11/57* (2006.01)
*G01R 15/00* (2006.01)
*G01R 15/08* (2006.01)
*G01R 7/00* (2006.01)

(52) U.S. Cl. ...................................... 324/115; 324/141

(58) Field of Classification Search .................. None
See application file for complete search history.

(56) References Cited

U.S. PATENT DOCUMENTS

| 4,532,470 | A | * | 7/1985  | Wiesmann ............... 324/76.11 |
| 5,530,373 | A | * | 6/1996  | Gibson et al. ............... 324/758 |
| 5,714,878 | A | * | 2/1998  | Saito et al. ............... 324/121 R |
| 5,923,161 | A | * | 7/1999  | Frankovitch et al. ........ 324/115 |
| 6,459,968 | B1 |   | 10/2002 | Kochie |
| 6,492,910 | B1 | * | 12/2002 | Ragle et al. ............ 340/870.02 |

FOREIGN PATENT DOCUMENTS

| DE | 197 12 078 | 10/1998 |
| JP | 55 027907  | 2/1980  |
| JP | 06 258356  | 9/1994  |

OTHER PUBLICATIONS

EP Search Report; EP Application No. 08162430.6-2216; Dated Dec. 4, 2008; 8 pages.

* cited by examiner

*Primary Examiner*—Ha Tran T Nguyen
*Assistant Examiner*—Roberto Velez
(74) *Attorney, Agent, or Firm*—Perkins Coie LLP

(57) ABSTRACT

A digital multimeter having improved recording functionality is disclosed. The digital multimeter disclosed incorporates a rotary switch, a series of keys and buttons, and a digital display so as to provide highly integrated, programmable and configurable features. Several of these features, either taken alone or in combination, provide significant improvements in ease of use, speed of user operation, and safety associated with use of the instrument.

7 Claims, 20 Drawing Sheets

DIGITAL MULTIMETER HAVING IMPROVED RECORDING FUNCTIONALITY

BACKGROUND

Multimeters are used for measuring a variety of parameters associated with electrical circuitry, such as currents, voltages, resistance and capacitance. A multimeter can be a handheld device useful for basic fault finding and field service work or a sophisticated bench instrument that can measure with a very high degree of accuracy. The instrument may be implemented with an analog meter deflected by an electromagnet or with a digital display such as an LCD (liquid crystal display) screen. While older analog multimeters might have basic accuracies of 5-10%, modern portable digital multimeters, or DMMs, may have accuracies up to ±0.025%.

Many modern digital multimeters enable a user to save a measurement for later retrieval and analysis. Typically, the instrument is configured such that a user presses a button or otherwise prompts the multimeter to save the measurement as it is taken. In some modern digital multimeters, a hold function is provided that freezes a displayed value once a stable reading is detected. Again, to prompt the hold function, the user must presses a button before taking a measurement and then presses that button once more to release the display.

Digital multimeters incorporate various tools such as the "save" and "hold" features for performing and analyzing different types of measurements and displaying measurement values in a digital format on a screen. Further capabilities and improvements are needed, however, in both hardware and software, to enable users to organize measurement information to be obtained by the instrument so as to operate the instrument efficiently, effectively, and safely.

The headings provided herein are for convenience only and do not necessarily affect the scope or meaning of the claimed invention.

DETAILED DESCRIPTION

An inventive digital multimeter instrument and inventive methods for operating a digital multimeter are disclosed below in detail. In particular, the digital multimeter as described herein incorporates a rotary switch, a series of keys and buttons, and a digital display so as to provide highly integrated, programmable and configurable features not available on conventional multimeters. Several of these features, either taken alone or in combination, provide significant improvements in ease of use, speed of user operation, and safety associated with use of the instrument. The modifications, alterations, and additions to conventional multimeters that were necessary to accomplish these features resulted in benefits that otherwise would not have been foreseen or appreciated by others skilled in the art.

Description of Components in a Highly-Integrated Multimeter Instrument

Figure 1:
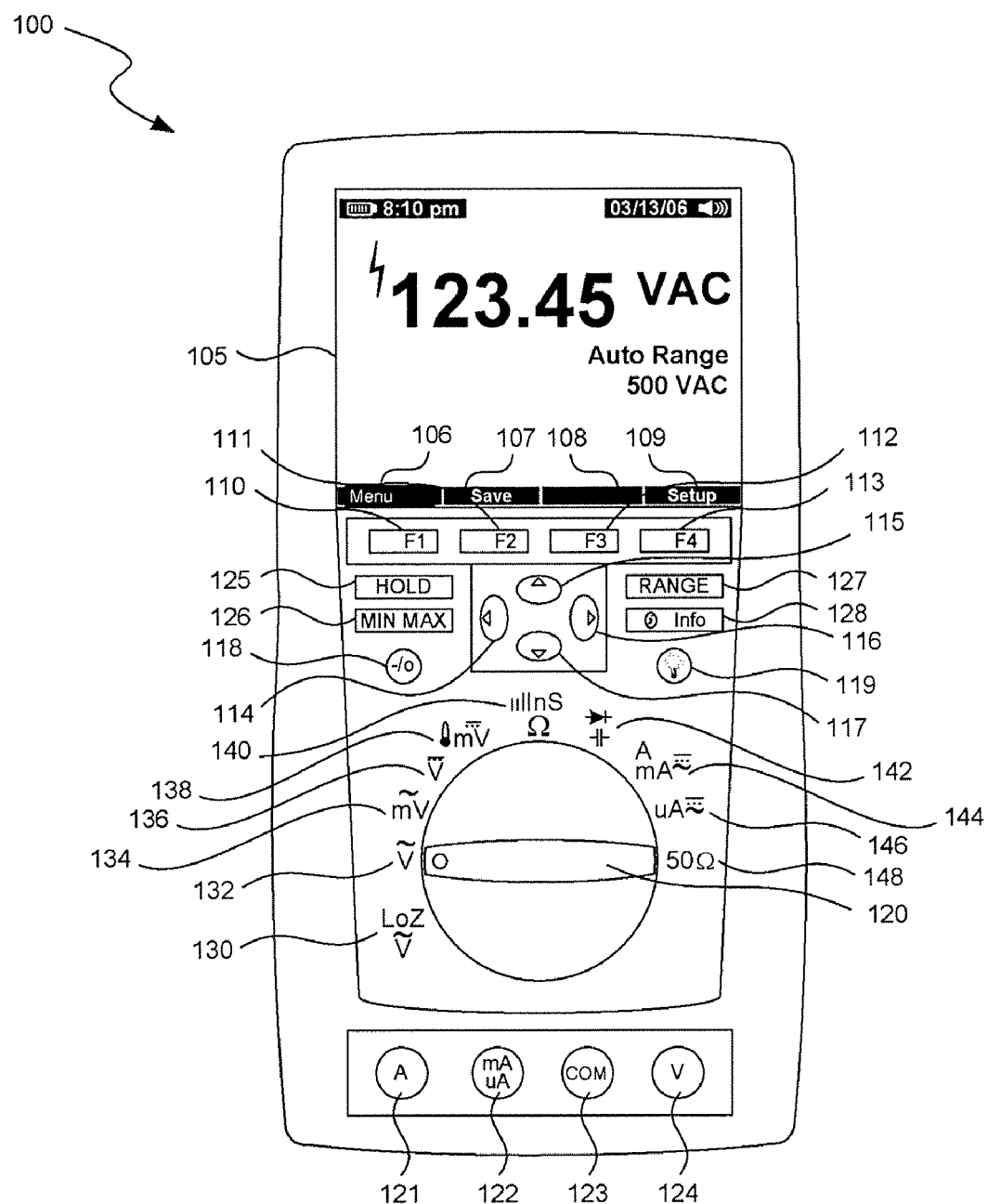
FIG. 1 illustrates the front face of a digital multimeter in accordance with an exemplary embodiment.
Figure 2:
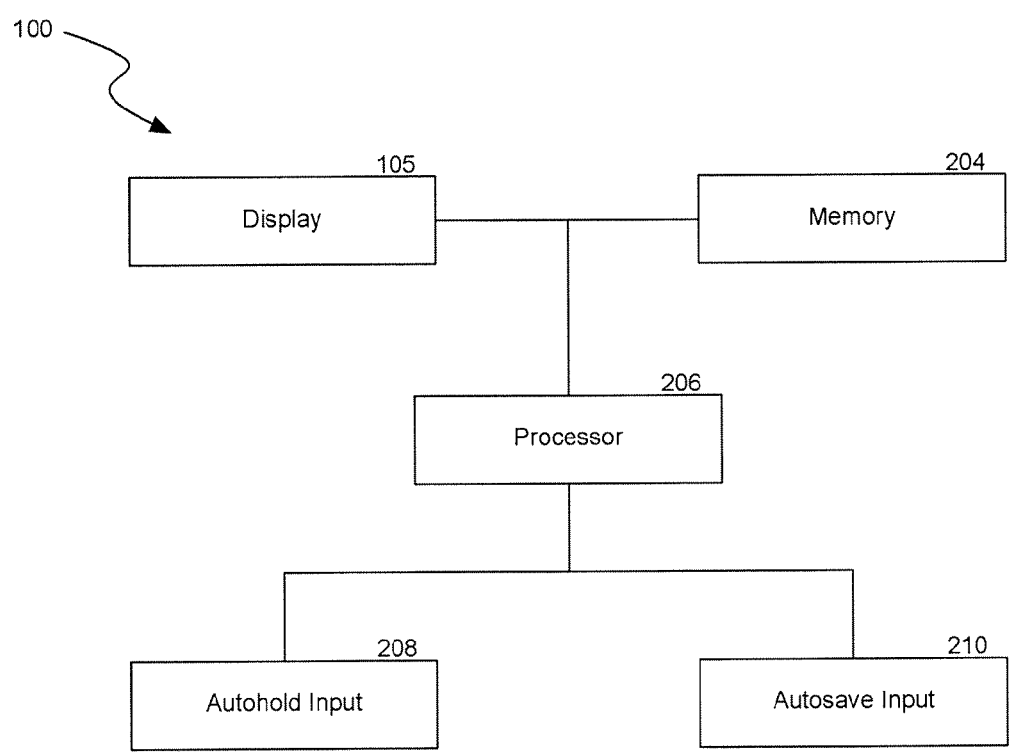
FIG. 2 illustrates a schematic diagram of the digital multimeter in accordance with an exemplary embodiment.

A face for an exemplary multimeter 100 is illustrated in FIG. 1. In the exemplary embodiment, the multimeter can be housed with a compact, handheld body, including contour indentations so as to improve suitability for one-handed operation. The face of multimeter 100 is generally characterized by a display area 105, a rotary switch 120, soft keys 110-113, navigation buttons 114-117, dedicated buttons 125-128, and various input jacks 121-124. Multimeter 100 can be powered by four AA alkaline batteries (not shown) and as described below in greater detail.

Measurement Functions and Modes

Multimeter 100 may be used to provide a primary measurement function, such as voltage, current, temperature, resistance, continuity, conductance, capacitance, diode test, low impedence, low resistance (50 Ohms), and AC/DC combinations ("AC+DC", "AC,DC"). Primary measurement functions are mutually exclusive to one another, such that no two primary functions can be measured simultaneously. However, secondary measurement functions associated with a circuit signal being measured, such as frequency, duty cycle, pulse width, decibels, and crest factor, can be provided at the same time as a primary function to convey additional measurement information for user display.

Meter 100 in accordance with an exemplary embodiment may be set to display certain "modes" that operate in conjunction with a measurement function. These "modes" determine how measurements are acquired and represented without changing the measurement function. "Min/Max," "Hold," "Range," "Peak," and "Record" are examples of modes that can operate in conjunction with the measurement function.

"Min/Max" is a mode in which the multimeter displays the live minimum, maximum, and average measurements that have occurred from the time the initial measurement of a parameter began. In other words, whenever a new maximum or minimum occurs—exceeding the previous maximum or minimum—the new value is stored. "Hold" is a mode in which a displayed value is frozen on the display. "Range" is a mode in which the range, or resolution, of the displayed value is specified by user input. "Recording" is the automatic saving of a sequence of measurements of a single parameter over a period of time for future review or storage. As examples, a resistance measurement can be recorded (using the "record" mode)

User Input Devices—Rotary Switch, Buttons, and Keys

As will now be described, multimeter 100 in accordance with an exemplary embodiment can include a rotary switch 120, a set of navigation buttons 114-117, a set of soft keys 110-113, an on/off switch 118, a backlight control button 119, and an [Info] button 128. Additionally, multimeter 100 can include dedicated mode buttons including [HOLD] 125, [MIN MAX] 126, and [RANGE] 127 buttons. A user can configure the device as desired by utilizing multi-function buttons or dedicated buttons or "soft key" buttons corresponding to display 105. Output can be presented to the user with the display 105, an indicator light, and/or an audible beeper. Multimeter 100 can include an internal memory for storing information, such as measurement values.

Soft keys 110-113 can be located in an area beneath the display 105 and positioned to correspond with labels 106-109 on the display. Pressing one of the soft keys 110-113 invokes the command indicated by the corresponding label on the display. Every screen has a custom set of soft key labels 106-109. Some screens have fewer labels than soft keys. When a soft key does not have a corresponding label, that soft key is disabled. For example, in the screen shown in FIG. 1, "Menu" 106 corresponds with soft key 110, "Save" 107 corresponds with soft key 111, "Setup" 109 corresponds with soft key 113, and soft key 112 does not have a corresponding label.

Navigation buttons 114-117 can be centrally located among the other buttons of multimeter 100. Navigation buttons 114-117 correspond to four cardinal directions: [UP] 115, [DOWN] 117, [LEFT] 114, and [RIGHT] 116. Navigation buttons 114-117 are used to move within menus and dialogs and to make choices and perform data entry. They can also be used to scroll through a sequence of information too extensive to be displayed on a single screen.

[Info] button 128 can provide access to context-sensitive information about the measurement function and display contents. Further details regarding [Info] button 128 are discussed below. The context-sensitive information may appear as a pop-up informational area which overlays most of the underlying screen.

Multimeter 100 can include a backlight for the display 105 to allow improved viewing in conditions of reduced light. The backlight is activated by backlight control button 119. Multimeter 100 can also include an On/Off button 118 used to turn multimeter 100 on or off.

In accordance with an exemplary embodiment, each position of rotary switch 120 corresponds to at least one different primary function. The functions are indicated by symbols surrounding rotary switch 120. Rotary switch 120 can include functions such as: AC voltage measurement from 0 V to 1000.0 V, AC millivolt measurement from 0 mV to 3000.0 mV, DC voltage measurement from 0 V to 1000.0 V, DC millivolt measurement from 0 mV to 3000.0 mV, resistance measurement from 0Ω to 500.0 MΩ, capacitance measurement from 0.001 nF to 50 mF, temperature measurement, AC current measurements from 0 mA to 20.000 A, AC current measurements from 0 µA to 5000.0 µA, DC current measurements from 0 mA to 20.000 A, DC current measurements from 0 µA to 5000.0 µA.

In addition to a primary function, each position of rotary switch 120 can correspond to a specific screen displaying pertinent information to the function in use. As shown in FIG. 1, some positions of rotary switch 120 may include more than one symbol, in which case the symbol closest to rotary switch 120 is the default measuring function. Where only one symbol corresponds to a position, that symbol denotes the default measuring function. A menu item in rotary switch positions can provide one or more virtual buttons corresponding to soft keys 110-113 to allow the user to select between primary functions available within the rotary switch position, as will be discussed below with reference to FIGS. 4 and 5.

Dedicated mode buttons provide direct single-press access to measurement modes. [HOLD] button 125 can be used to hold the currently displayed measurement value. [MIN MAX] 126 button can be used to capture the highest, lowest, and average readings over time. [RANGE] button 127 can be used to manually select a measurement range. Other modes may be selected by using soft keys 110-113 and navigation buttons 115-117 to make selections from menus on display 105.

In the example shown in FIG. 1, rotary switch 120 can remain in its current position when multimeter 100 is turned off and back on using the separate [ON/OFF] button 118. This method of turning multimeter 100 on and off allows multimeter 100 to be turned off and back on without losing track of the presently active measurement function, including any selected secondary function or modes.

When rotary switch is turned from one function to another, a display for the new function appears on display 105. In some embodiments, button choices made in one function do not to carry over into another function.

Analog connections on input jacks 121-124 can be used to provide input to be measured by multimeter 100. As shown in the example of FIG. 1, four input jacks 121-124 can be included along the bottom of multimeter 100 where the user connects input probes used to measure signals of interest. Output can be presented to the user with the display 105, an indicator light, and/or an audible beeper. Multimeter 100 can include an internal memory 204 for storing information, such as measurement values.

Multimeter User Display

As shown in FIG. 1, digital multimeter 100 includes a display 105, which may be an LCD screen or any other suitable type of display. In the illustrated embodiment, the rotary switch 120 in FIG. 1 is set to the V AC position, and so the display 105 exhibits a V AC primary measurement 134. As depicted in the figure, the measurement may be displayed in a bold type and/or in a comparatively larger font size in relation to other displayed measurements to indicate which measurement is the primary measurement. Display 105 may further exhibit a secondary measurement, which is a measurement on the display representing an additional function shown concurrently with the primary measurement.

Autosave

The digital multimeter of an exemplary embodiment incorporates an innovative "autosave" function, which enables a user to provide configure the multimeter a single time, and then display and store a series of stable measurements. Once the instrument is configured for this function, a user can simply move the probes of the instrument from node to node in one or more circuits, and the instrument provides measurements and saves them in memory without necessitating any additional user selections on the multimeter for saving each stable reading. Since the multimeter filters out unstable open leads measurements from the stable measurement results, the leads can be moved between measurement points without triggering an intervening automatic update.

Figure 3:
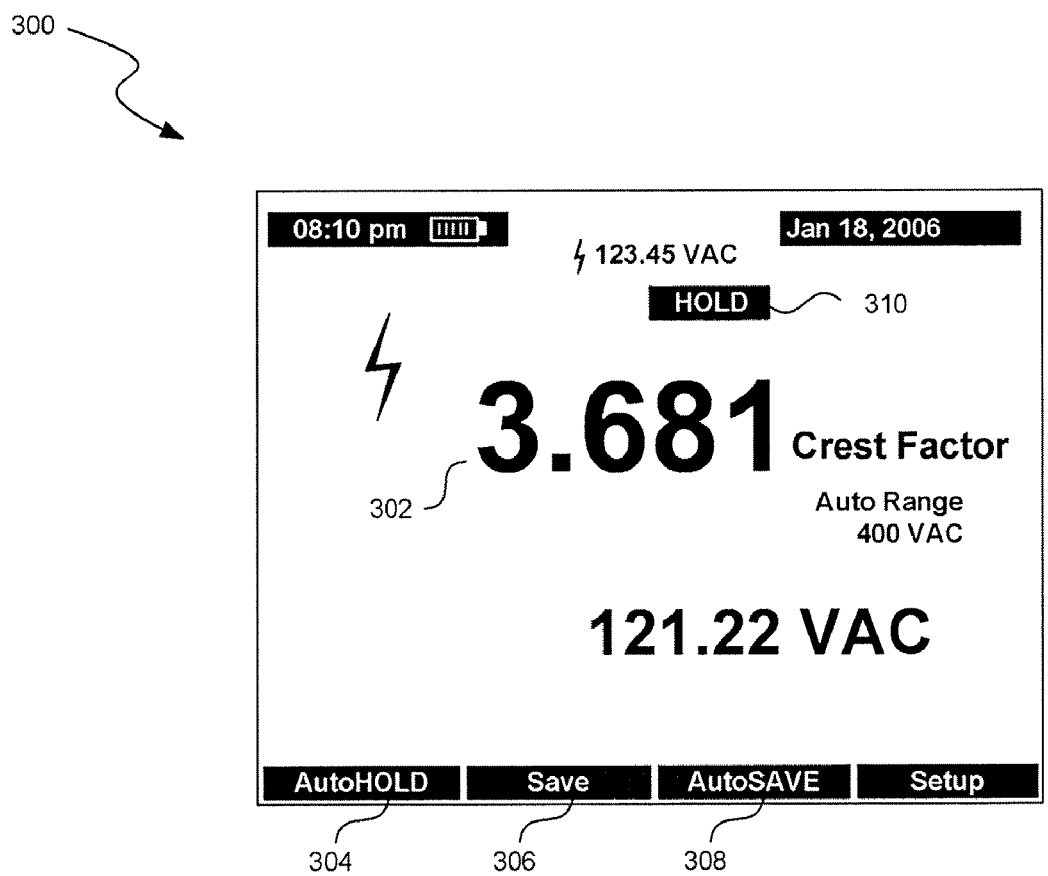
FIG. 3 illustrates an example of a screen in accordance with an exemplary embodiment, in which "auto save" functionality can be initiated.

FIG. 3 illustrates an example of a screen 300 in which the autosave function can be initiated. Screen 300 shows a reading 302 that has been frozen on the display by pressing dedicated [HOLD] button 125. An annunciator 310 can display that the hold function is active. As shown in FIG. 3, soft key functions in screen 300 include "AutoHOLD"'" 304, "save" 306, and "AutoSAVE" 308. If the user selects "AutoHOLD" 304 by using Autohold Input 208, which can be soft key 110, processor 206 will automatically hold every subsequent stable reading on display 105. If the user selects "save" 306, the measurement held on screen 300 will be saved to memory 204. If the user selects "AutoSAVE" 308 by using the Autosave Input 210, which can be soft key 112, processor 206 will automatically hold subsequent stable readings on display 105 and save the subsequent stable readings to memory 204. The processor can be programmed to beep or flash the measurement on display 105 each time a new stable measurement is detected during autohold or autosave functions.

Figure 4:
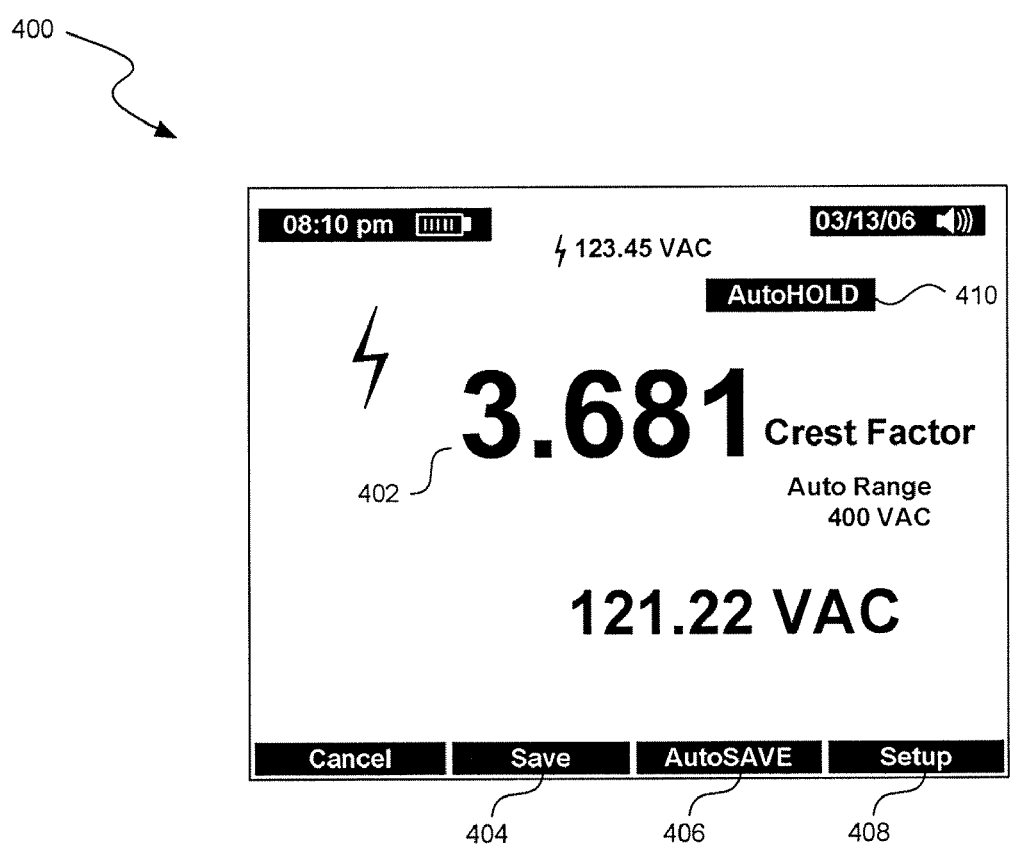
FIG. 4 illustrates an example of a screen in which the autosave function can be initiated.

FIG. 4 illustrates another example of a screen 300 in which the autosave function can be initiated. Screen 400 shows a reading 402 that has been frozen on the display by selecting autohold in screen 300. An annunciator 410 can display that the autohold function is active. As shown in FIG. 4, soft key functions in screen 400 include "cancel," "save" 404, and "AutoSAVE" 406. If the user selects "cancel," the autohold function will be deactivated. If the user selects "save" 404 the measurement held on screen 400 will be saved to memory 204. If the user selects "AutoSAVE" 406 by using the Autosave Input 210, which can be soft key 112, processor 206 will automatically hold subsequent stable readings on display 105 and save the subsequent stable readings to memory 204.

Figure 5:
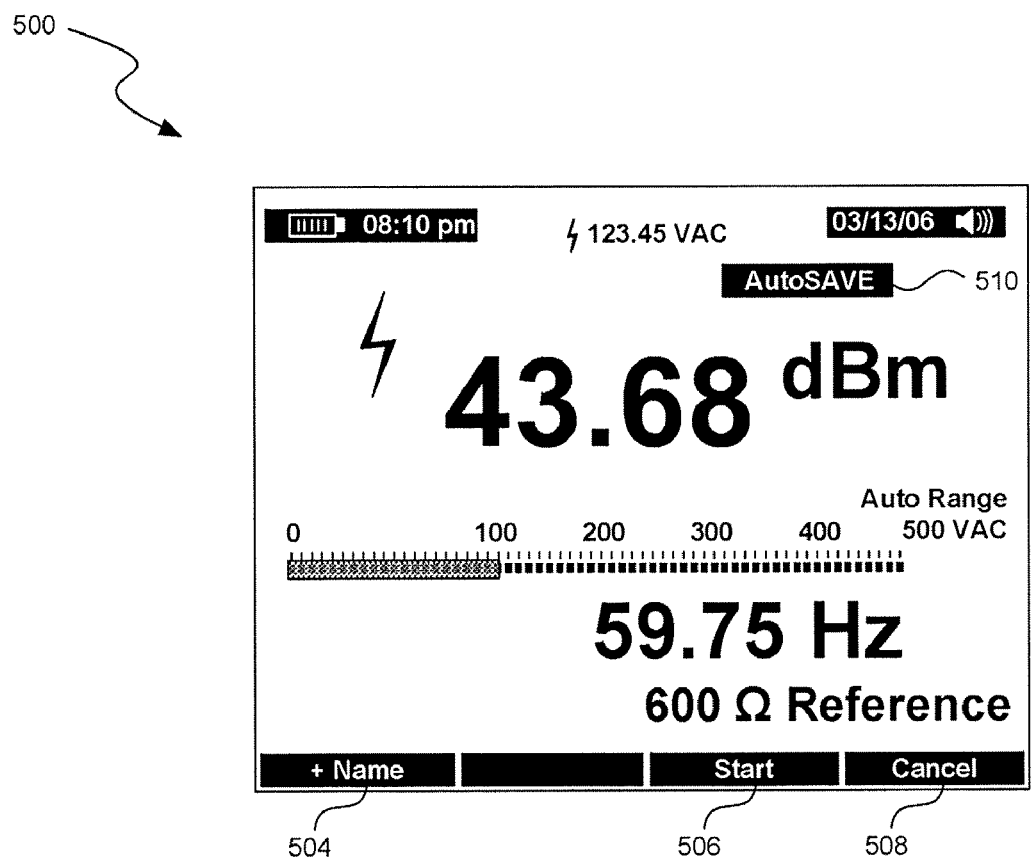
FIG. 5 illustrates an example of a screen that can appear after the autohold function has been initiated.

FIG. 5 illustrates an example of a screen 500 that can appear after the autosave function has been initiated. An annunciator 510 displays that the autosave function is active. As shown in FIG. 5, soft key functions in screen 500 includes "+Name" 504, "Start" 508, and "Cancel" 508. The user can name the sequence of measurements that are about to be taken by selecting "+Name" 504. Once a name is assigned, the same name is used for all saved measurements subsequently taken. The procedure for naming a sequence of measurements after "+Name" has been selected is explained in detail below with reference to FIG. 10.

By selecting "Start", the autosave sequence will begin using the most recently used name and the next stable value will be saved to memory 204. If the same soft key is set to "AutoSave" in screens 300 and 400 and "Start" in screen 500, then the user can quickly start the autosave sequence by pressing soft key 112 twice in either screen 300 or screen 400. The autosave sequence can also be activated by pressing dedicated [HOLD] button 125 while in screen 500. If the sequence is activated by pressing [HOLD] button 125, the previously saved measurement can be used as the first stable reading. Selecting "Cancel" can cause the display to return to the previous screen in which the autosave function was selected. If dedicated [HOLD] button 125 is pressed while the autosave function is in progress, the live measurement value can be saved to memory 204 as if it had been detected as a stable value and automatically saved. The ranging mode and range may be manually changed during the autosave function. The soft keys 110-113 can be set so that the only available soft key function is "Cancel" after the autosave function has been started, but before the first measurement has been taken and recorded.

Figure 6:
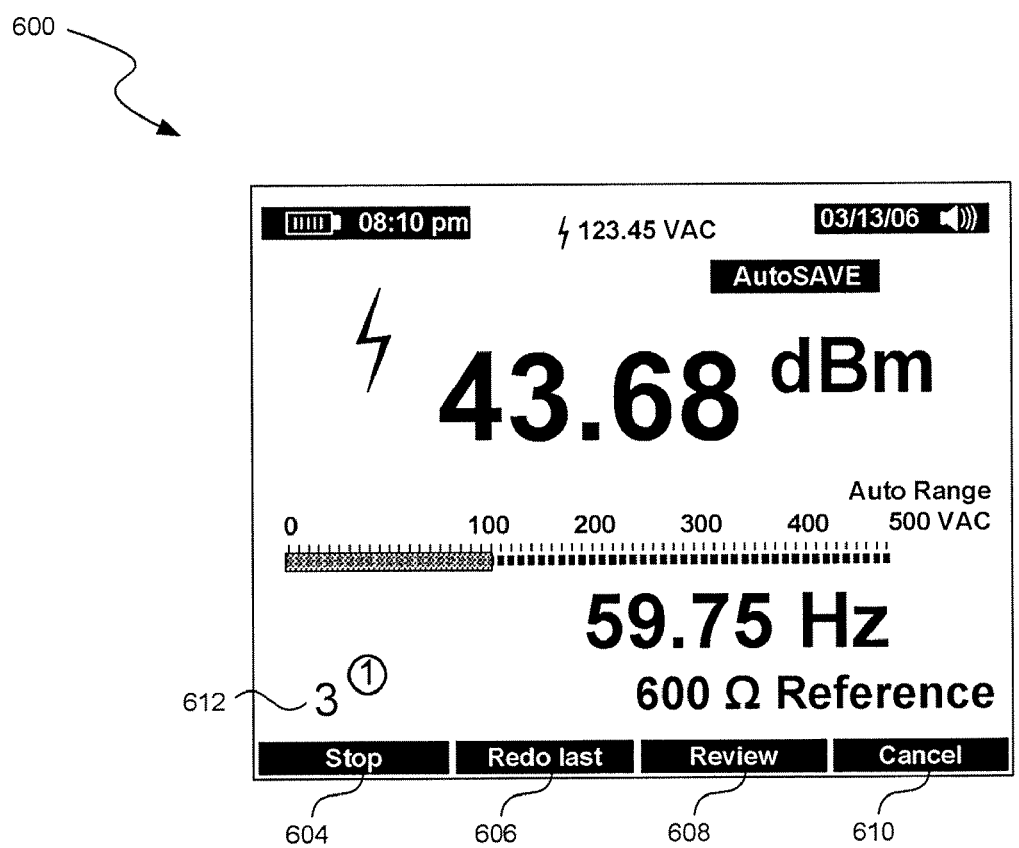
FIG. 6 provides an example of a screen that can appear after the first measurement of a sequence has been taken while the autosave function is active.

FIG. 6 provides an example of a screen 600 that can appear after the first measurement of a sequence has been taken while the autosave function is active. Screen 600 can include a relative sequence number 612 to reflect which increment within the sequence is shown in the display. As shown in FIG. 6, the relative sequence number 612 is the number "3," which indicates that the reading 302 is the third reading in the sequence and the multimeter is waiting for the next stable reading. When one or more measurements have been saved, the soft keys can provide for redo of the last saved reading and reviewing all previously saved readings.

In FIG. 6, soft key functions in screen 600 include "Stop" 604, "Redo last" 606, "Review" 608, and "Cancel" 610. Selecting "Stop" 604 can deactivate the autosave function and returns the display to the screen shown prior to selecting the autosave function. Selecting "Redo last" 606 can cause the relative sequence number 612 to blink indicating pending replacement. Once the multimeter detects a new stable measurement, this value will replace the previously recorded value. The saved measurement can reuse the name assigned to the previously recorded value it has replaced. If the name included an auto-increment number, the newly recorded measurement will include the auto-increment number such that the auto-increment numbers in the sequence have an uninterrupted order. Auto-incrementing numbers are discussed in detail below with reference to FIGS. 9-16. Selecting "Review" 608 can allow a user to review and optionally edit previously saved measurements. Selecting "Cancel" 610 deactivate the autosave function and delete all previously saved measurements taken during the sequence.

Figure 7:
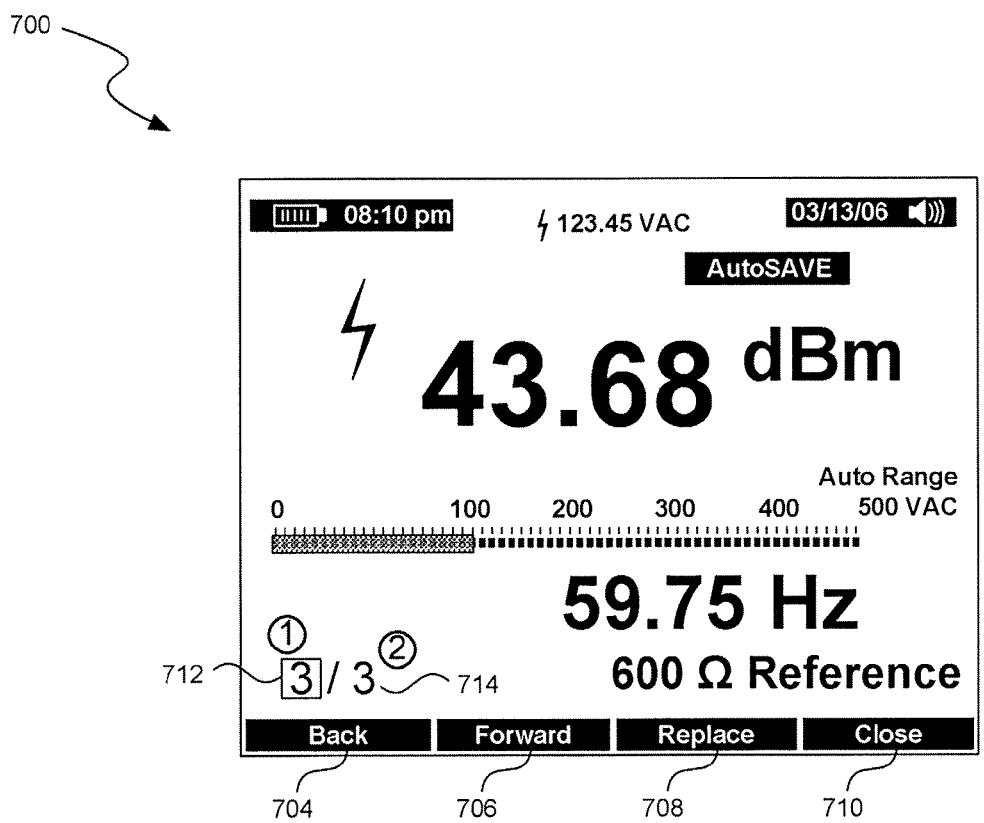
FIG. 7 illustrates an example of a screen that can appear after "Review" is selected in the screen of FIG. 6.

FIG. 7 illustrates an example of a screen 700 that can appear after "Review" 608 is selected in screen 600 of FIG. 6. As shown in FIG. 7, soft key functions in screen 700 include "Back" 704, "Forward" 706, "Replace" 708, and "Close" 710. Relative sequence number 712 can be highlighted and can be augmented with a slash character and the total count of saved measurements 714. Selecting "Back" 704 can change the screen to show the previous measurement in the sequence, if any. Selecting "Forward" 706 can change the screen to show the next measurement in the sequence, if any. Relative sequence number 712 changes as the user scrolls back and forth through the measurements to indicate which measurement in the sequence is displayed. Measurements can be saved with a time stamp.

Figure 8:
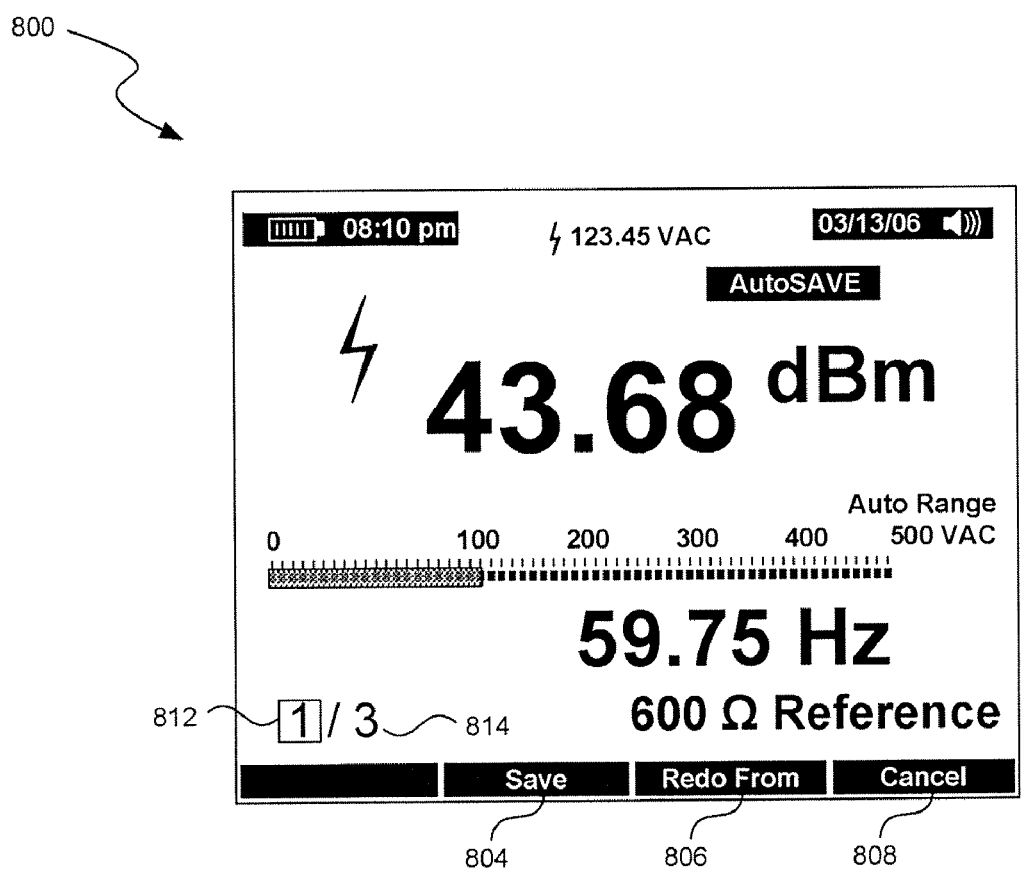
FIG. 8 illustrates an example of a screen that can appear after "Replace" is selected in the screen of FIG. 7.

FIG. 8 illustrates an example of a screen 800 that can appear after "Replace" 708 is selected in screen 700 of FIG. 7. As shown in FIG. 8, soft key functions in screen 800 include "Save" 804, "Redo From" 806, and "Cancel" 808. Relative sequence number 812 can blink after "Replace" 708 is selected. Once the multimeter detects a new stable measurement, this value will replace the previously recorded value. The saved measurement can reuse the name assigned to the previously recorded value it has replaced. If the name included an auto-increment number, the newly recorded measurement will include the auto-increment number such that the auto-increment numbers in the sequence have an uninterrupted order. Auto-incrementing numbers are discussed in detail below with reference to FIGS. 9-16.

In screen 800 of FIG. 8, selecting "Save" 804 saves the displayed value, rather than the next stable value, over the previous value at the currently displayed relative sequence number 812. Pressing dedicated [HOLD] button 125 performs the same function as "Save" 804 in screen 800. Selecting "Redo From" 806 can cause all of the measurements with higher relative sequence numbers in the sequence to be discarded and for the multimeter to resume saving from this relative sequence number as if it were now the last in the sequence. In other words, the user can back up to a previous point in the sequence of measurements and resume the sequence from that point such that the new automatically saved measurements overwrite those previously saved in the same positions in the sequence. Once the user has selected "Redo From" 806, a message can be displayed requesting the user to confirm that the redo function is being selected to prevent accidental loss of measurements. If the user confirms the operation, the multimeter saves the measurement over the previous value which now becomes the last relative sequence number of the sequence. Then, the screen will return to the screen shown after the autosave function was selected and the autosave function will continue saving stable measurements.

Auto-Incrementing Numbers

When a user saves a current reading, the display may list various names under which the user can save the reading. Naming saved readings helps the user identify what the reading signifies, e.g., what the multimeter was measuring, or the location where the reading was taken. The user may select one of the names or edit one of the names to suit the user's needs. If multimeter 100 is recording a series of readings sequentially in a single location, it is beneficial to have some way to distinguish between readings and to identify the order of the readings. Multimeter 100 may include an auto-incrementing number function that automatically assigns numbers to sequential readings under a single name.

Figure 9:
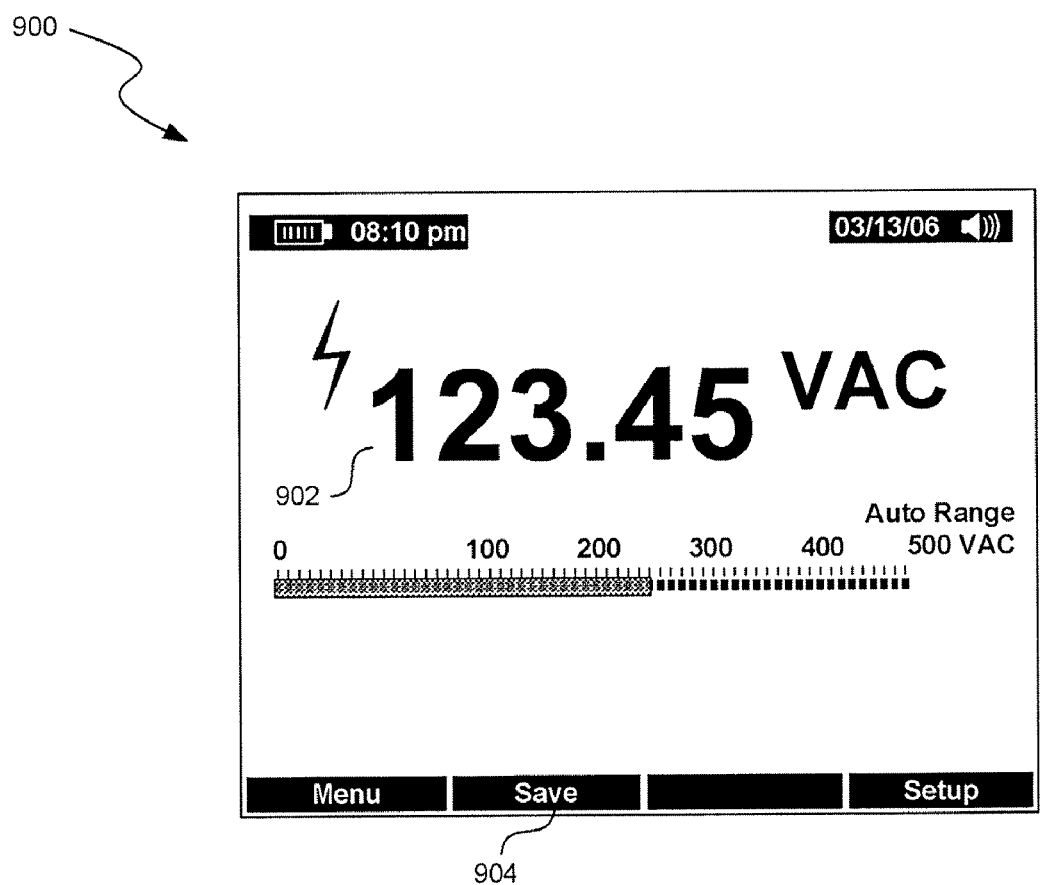
FIG. 9 shows a screen displaying a live reading.
Figure 10:
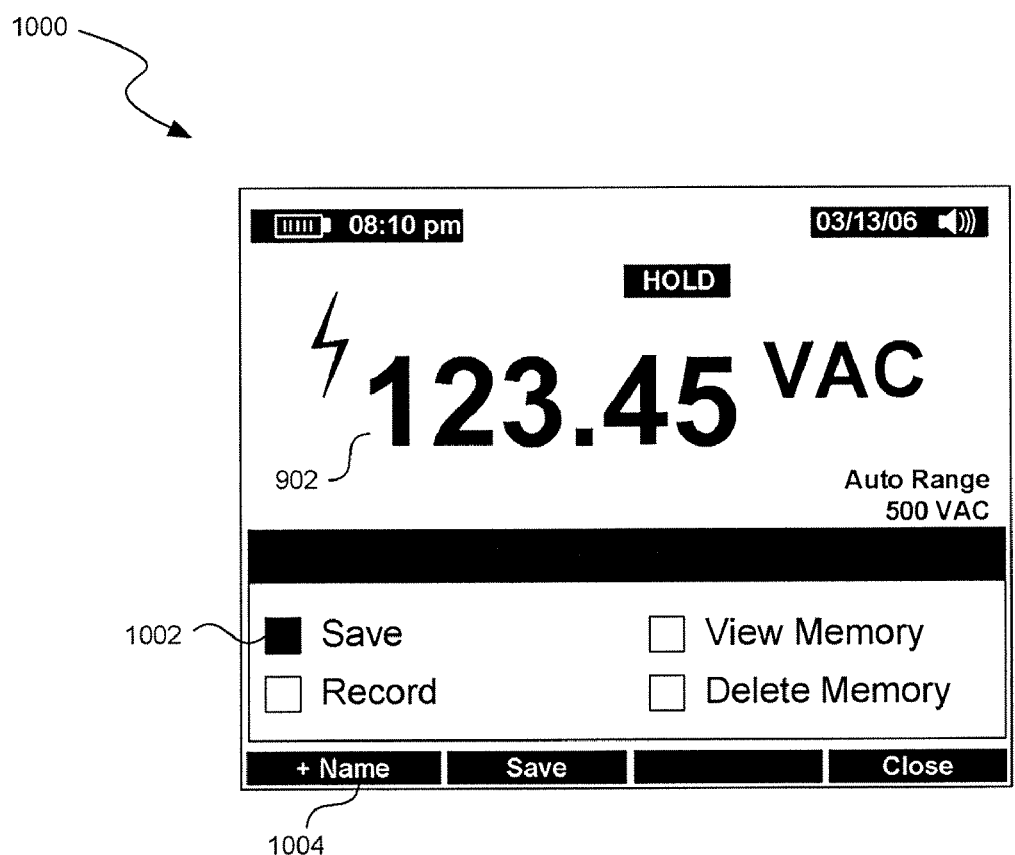
FIG. 10 shows the display after the user had selected "Save".
Figure 11:
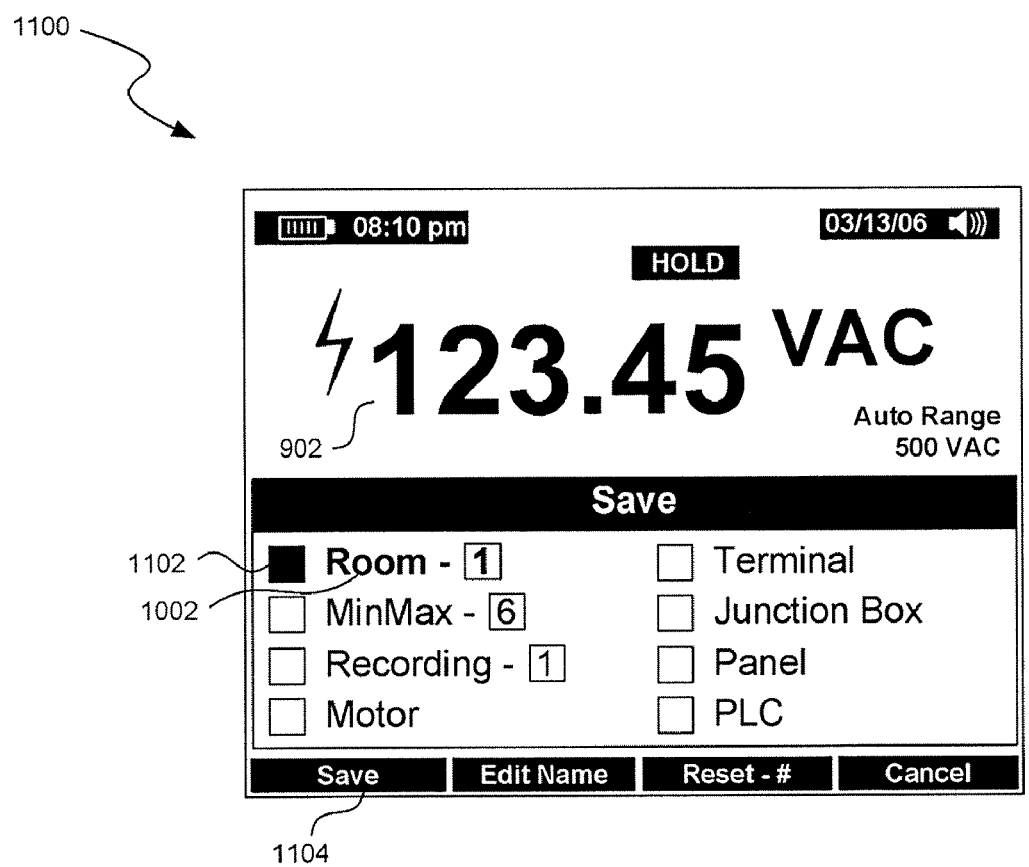
FIG. 11 shows the display providing a list of names after the user has selected "+Name" in FIG. 10 or FIG. 5.
Figure 12:
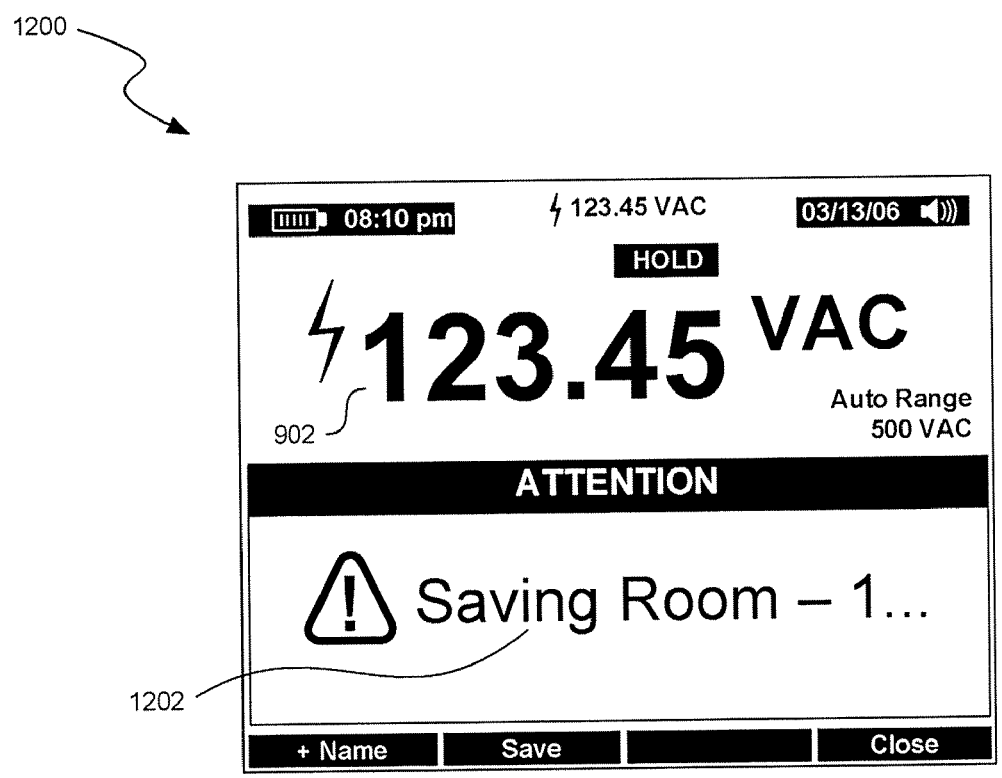
FIG. 12 shows display after the user has selected "Save" using a soft key in FIG. 11.
Figure 13:
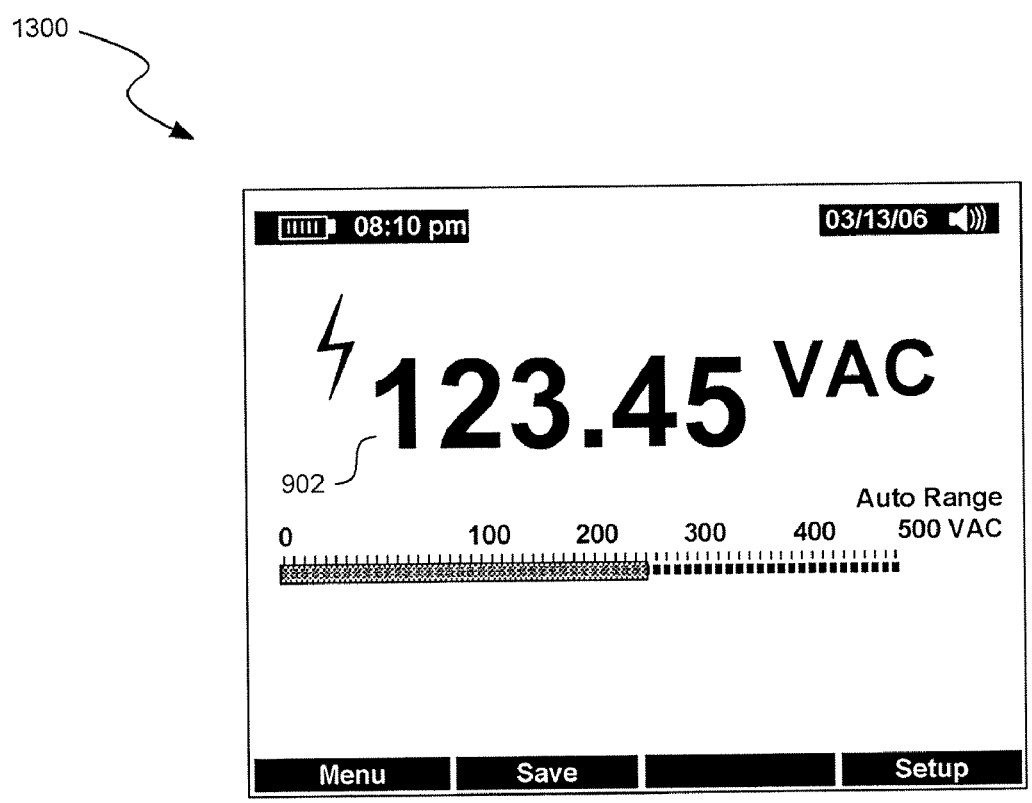
FIG. 13 shows display after the measurement has been saved and the display has returned to the VAC measurement screen.

An example of the auto-incrementing number procedure is shown in FIGS. 9-16. FIG. 9 shows a screen 900 displaying a live reading 902. As shown in FIG. 9, a soft key function in screen 900 can include "Save" 904. FIG. 10 shows a screen 1000 after the user had selected "Save" 902 in screen 900. The filled in square 1102 next to "Save" denotes that the save function is selected from the menu. FIG. 11 shows a screen 1100 providing a list of names after the user has selected "+Name" 1004 in FIG. 10, which is the same layout of the screen displayed after a user selects "+Name" 504 in FIG. 5. The first three names in the left hand column of the list include auto-incrementing numbers. The filled in square 1102 next to "Room-1" 1106 denotes that the name "Room-1" is selected. FIG. 12 shows a screen 1200 after the user has selected "Save" 1104 using a soft key in FIG. 11. Message 1202 informs the user that the measurement is being saved as "Room-1." After saving, a message (not shown) appears for half a second confirming that the reading is saved with the name "Room-1." FIG. 13 shows a screen 1300 after the measurement has been saved and the display has returned to the VAC measurement screen. If the user decides to save another reading, he can press the "Save" soft key twice, which can bypass the menu of names shown in FIG. 11 and immediately save the reading with the last name that was selected.

Figure 14:
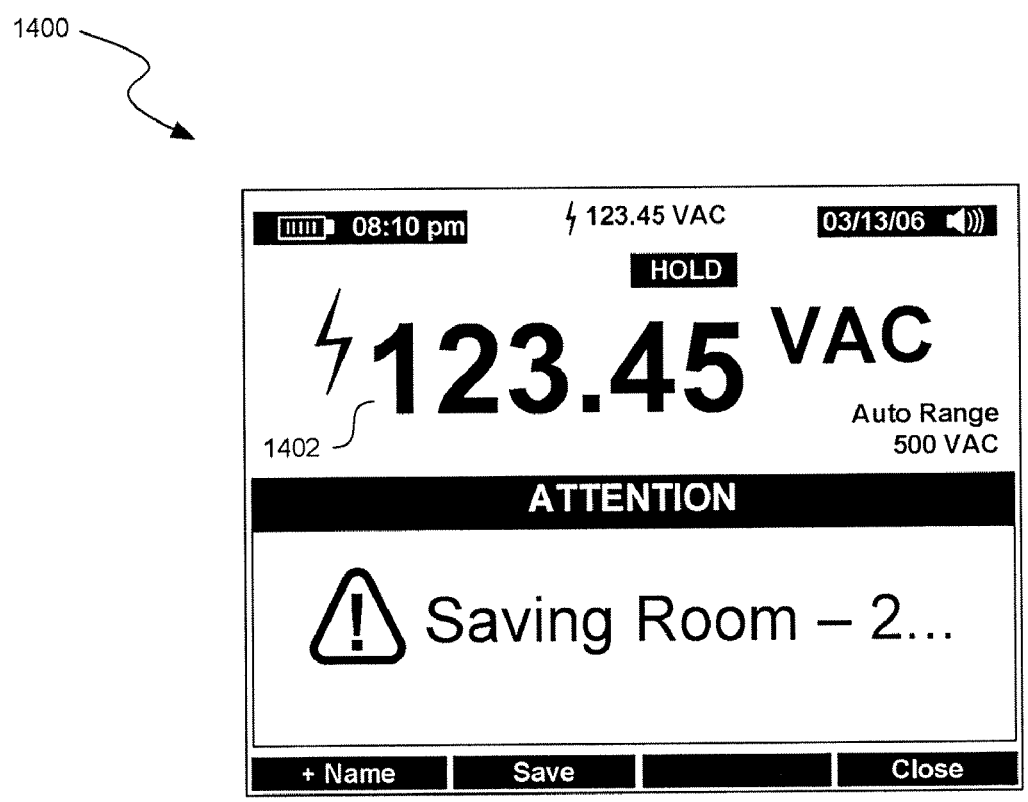
FIG. 14 shows the display when the next reading, which has the same value as the first reading, is being saved.
Figure 15:
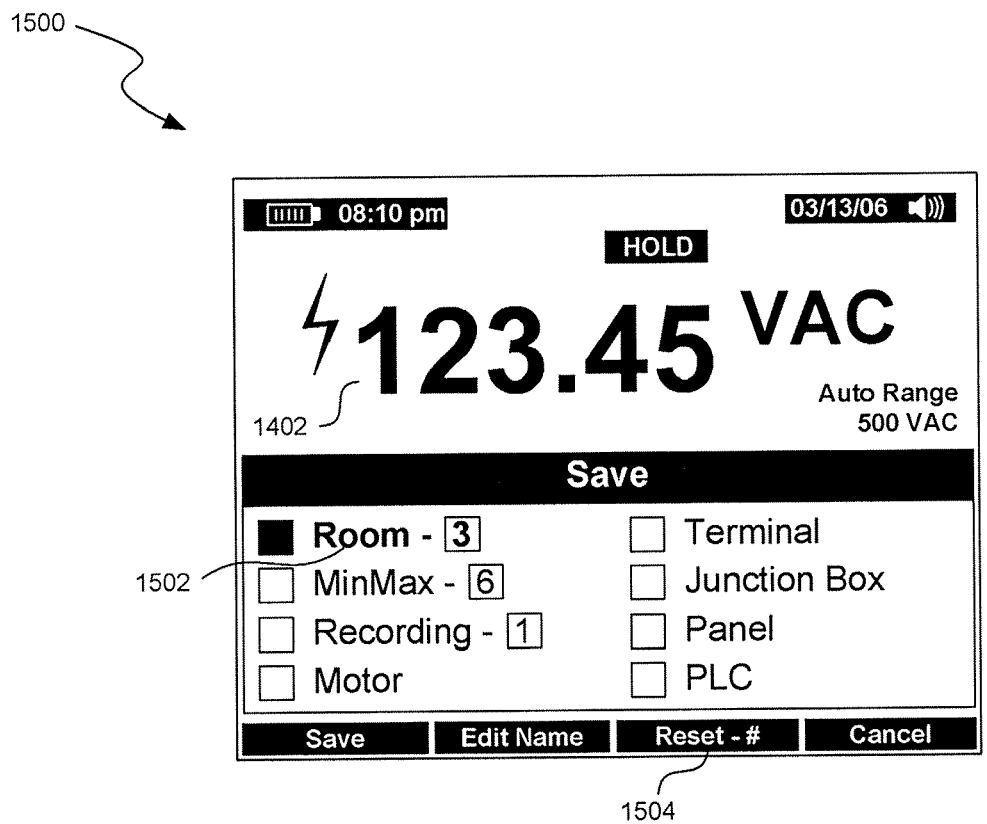
FIG. 15 shows the list of names after two readings have been recorded under the name "Room."
Figure 16:
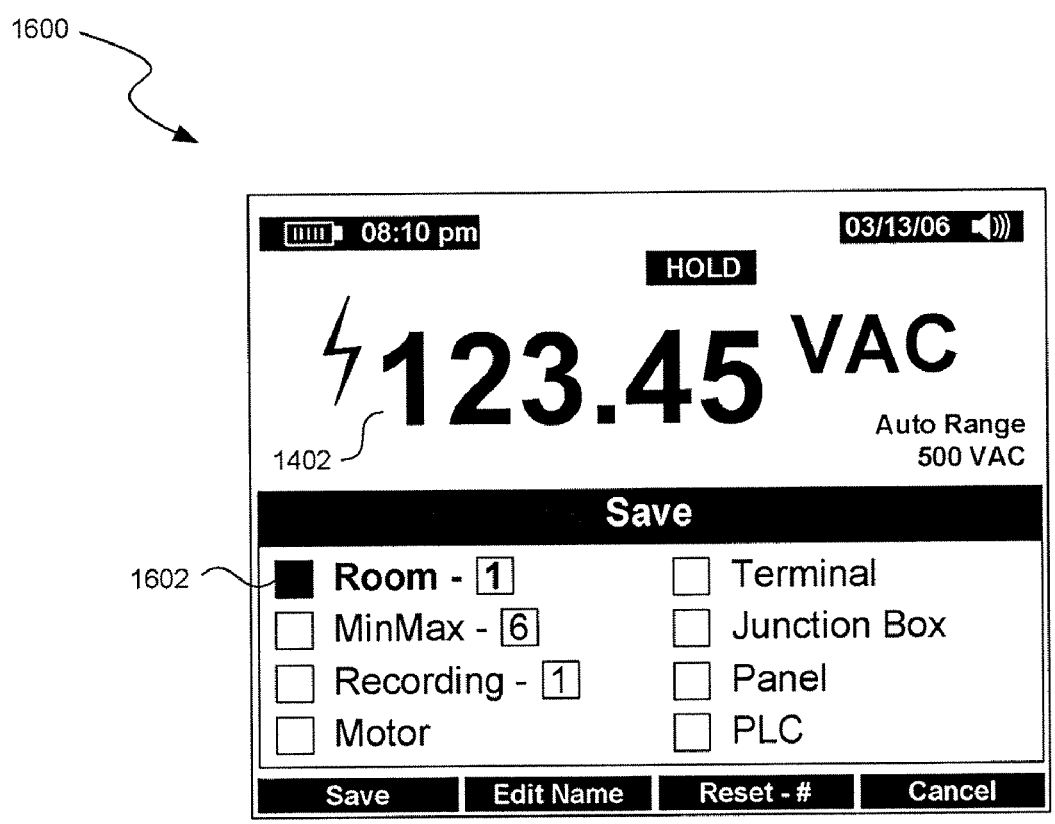
FIG. 16 shows the list of names after the auto-incrementing number has been reset.

FIG. 14 shows a screen 1400 when the next reading 1402, which has the same value as the first reading 902, is being saved. FIG. 15 shows a screen 1500, which can appear after two readings have been recorded under the name "Room." At this point, "Room-3" 1504 is listed in the menu of names, since there are already two readings recorded under the name "Room." If the user selects "Reset-#" 1504 while "Room-3" 1502 is selected in the screen of FIG. 15, the auto-incrementing number in the selected name can be reset to 1. FIG. 16 illustrates the menu of names after "Reset-#" 1504 has been selected in screen 1500. "Room-1" 1602 is listed in the menu of screen 1600 instead of "Room-3" 1504.

Figure 17:
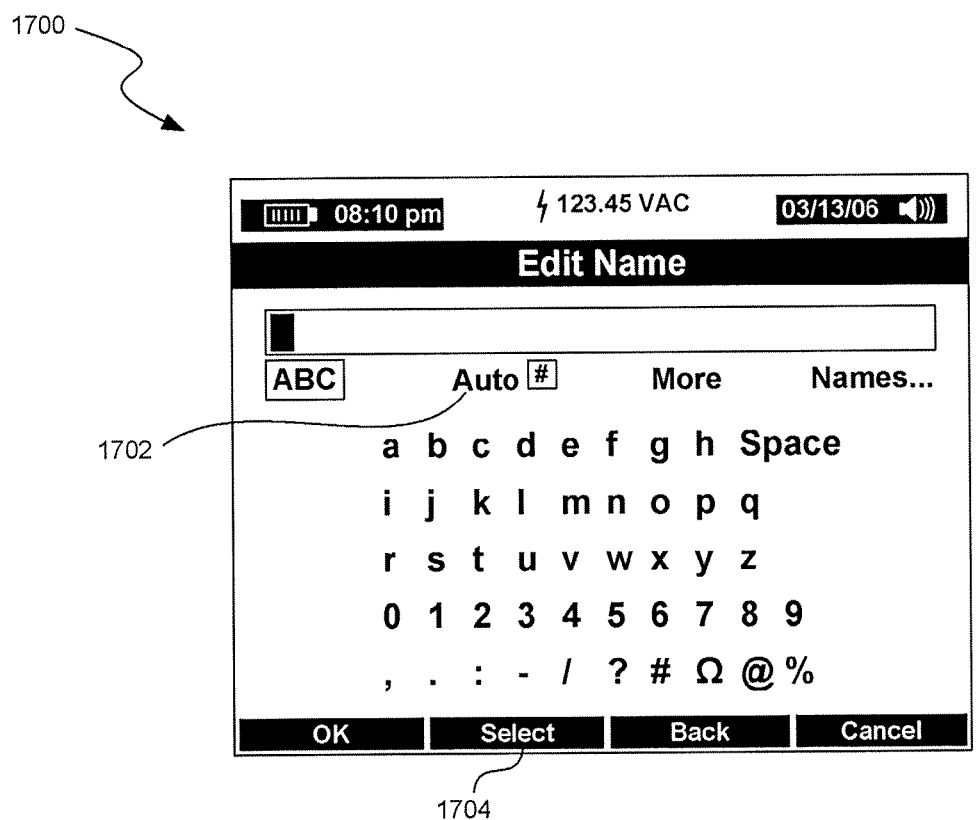
FIG. 17 shows a screen displaying an example character palette that may be used to edit names from the menu of names.

Meter 100 may have a default of pre-defined names. For instance, FIG. 11 illustrates a menu of eight pre-defined names. However, the user may edit these names or input more names on a computer and download the additional names to multimeter 100. Additional names may also be downloaded from a memory storage device. FIG. 17 shows a screen displaying an example character palette that may be used to edit names from the menu of names. The user can use the navigation buttons 114-117 to highlight characters. Then, the user may press the soft key corresponding to "Select" to select the highlighted character. "Auto-#" 1702 may be highlighted using the navigation buttons 114-117 and selected by pressing the soft key corresponding to "Select" 1704 to append an auto-incrementing number to a name. If the user elects not to use auto-incrementing numbers, a time stamp attached to each measurement can distinguish the measurements from one another. However, the time stamps may be out of order when the user replaces measurements within the sequence after utilizing the autosave function. In this situation, the auto-incrementing numbers can facilitate identifying the measurements.

Min/Max Background Recording

Min/Max is a mode in which the multimeter displays the live minimum, maximum, and average measurements that have occurred from the time the initial measurement of a parameter have begun. In other words, whenever a new maximum or minimum occurs—exceeding the previous maximum or minimum—the new value is stored, the respective elapsed time is updated. The multimeter can give output, such as beeping, whenever a new minimum or maximum measurement occurs. Min/Max mode can be activated by the user pressing [MIN MAX] 126 in the embodiment shown in FIG. 1.

Recording is the saving of a sequence of measurements for future review or storage. In some embodiments, the multimeter will begin recording automatically during min/max mode. The multimeter can record each minimum, maximum, and average recordings at certain intervals of time. The multimeter can additionally record measurements when a predetermined event, such as the measurement value crossing an event recording threshold, has occurred.

Adjustment Threshold

Figure 18:
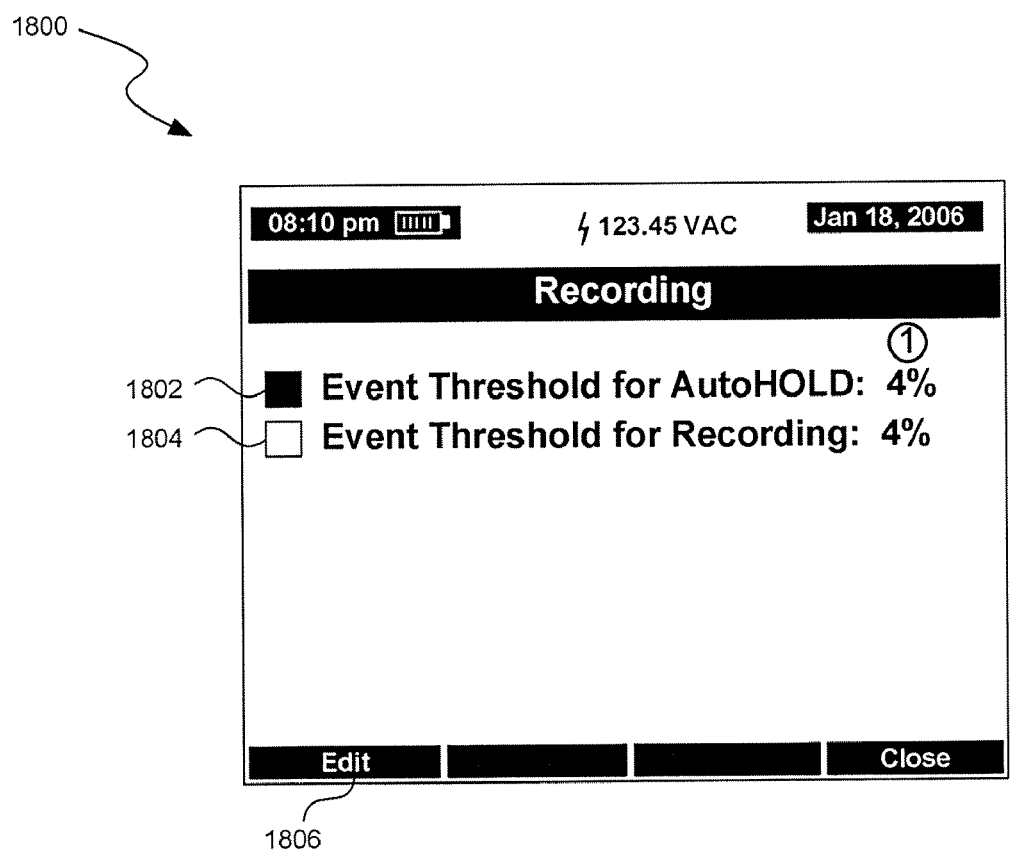
FIG. 18 illustrates an example screen having a menu for modifying the threshold for the autohold and event recording functions.
Figure 19:
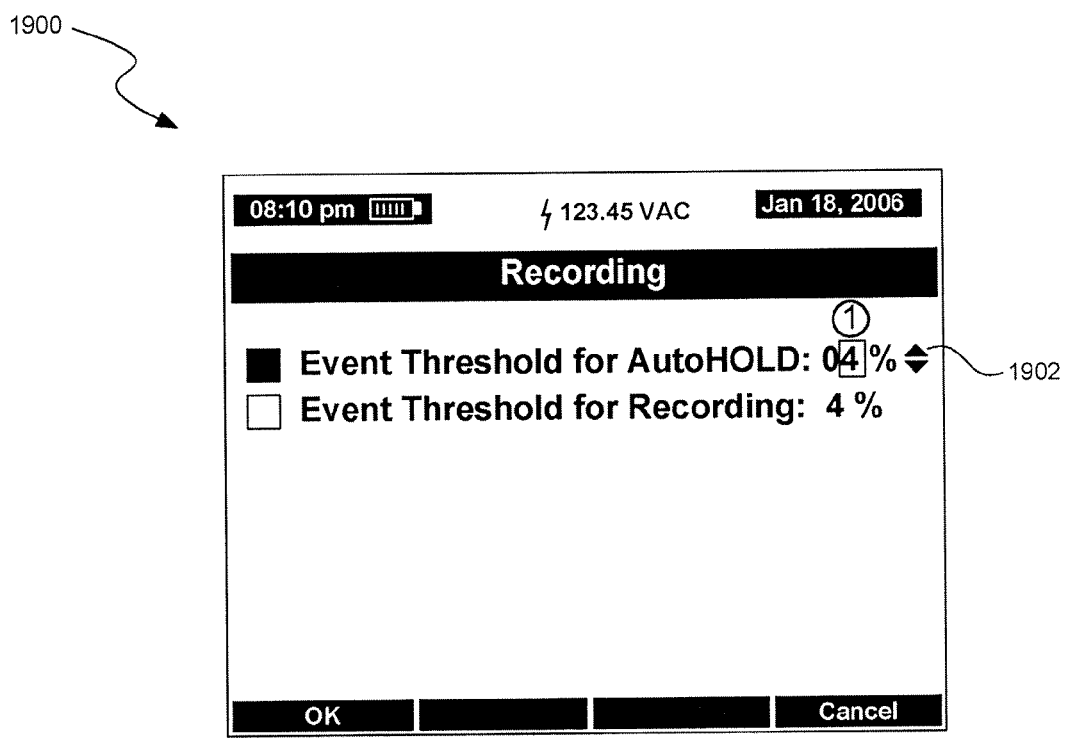
FIG. 19 illustrates an example screen in which the threshold for the event recording function can be edited.

The multimeter can come with a default threshold value. For instance, the threshold value may be 4%. An interface can be provided for modifying this threshold value. FIGS. 18 and 19 provide an example of a procedure that can be used to modify the threshold value. FIG. 18 illustrates an example screen 1800 having a menu for modifying the threshold for the autohold and event recording functions. In FIG. 18, the filled in square 1802 next to "Event Threshold for AutoHold" can denote that the threshold for autohold has been selected. The open square 1804 next to "Event Threshold for Recording" can denote that the threshold for event recording has not been selected. In some embodiments, the user my user navigation buttons 114-117 to select which function on the menu to modify. By selecting "Edit" 1806, which can be done by pressing soft key 110, screen 1800 can change to screen 1900, which is shown in FIG. 19 and in which the value of the event recording threshold can be changed. The "4" in "04%" next to "Event Threshold for Recording" is highlighted in FIG. 19, which means that the user can change the value. Arrows 1902 can be provided to notify the user that the up and down navigation buttons can be used to change the value of the event recording threshold. Once the event recording threshold value has been altered within the display, the processor uses the new threshold value to determine whether measurements are stable when the event recording function is used. Likewise, when the autohold threshold value has been modified, the processor uses the new threshold value to determine whether measurements are stable when the autohold function is used.

Easy Recording

Easy recording is a feature that allows a user to record one or both of event recording or interval recording by prompting the multimeter once without the user having to configure parameters, such as recording duration or a sample interval. Interval records are captured when the time to store a measurement value, as designated by the recording sample interval (how often the measurement is recorded, has arrived. The user can set the duration and sample interval for interval recording. By using easy recording, the user can prompt the multimeter to record, and the processor will automatically begin recording with a sample interval chosen by the processor. Rather than having a predetermined duration, easy recording can continue until a user prompts the multimeter to stop recording, the memory runs out of room, or the multimeter loses power. As the memory fills and time passes during recording, the processor can down-sample recordings to make more space for future recordings and the processor can begin to record with a larger interval sample, which will decrease the amount of memory necessary to continue recording. The processor can be programmed to downsample sampled data to reduce its size and change the interval sample in response to a variety of conditions, such as a certain amount of time passed and/or a certain amount of remaining memory. Events can be preserved during downsampling so that meaningful data is not lost.

Battery Saver Mode

Figure 20:
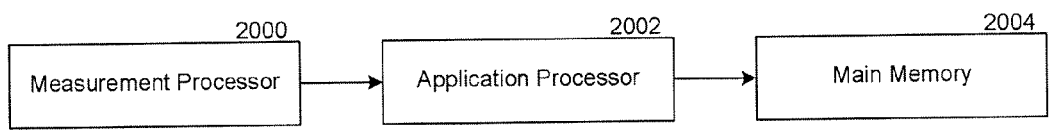
FIG. 20 illustrates an example configuration of processors that facilitates battery saver mode.

To conserve energy, the multimeter can include a battery saver mode, which is particularly useful when the multimeter is recording for long periods of time without any user interaction. FIG. 20 illustrates an example configuration of processors that facilitates battery saver mode. A measurement processor 2000 is connected to an application processor 2002, which is connected to a main memory 2004. Measurement processor can be programmed to take raw, live measurements. Application processor 2002 can be programmed to perform other functions, including saving measurements to main memory 2004 or changing the range of measurements.

Battery saver mode can be activated in response to a variety of conditions, such as a user input or a certain amount of time passed without any user input. During battery saver mode, display 105 can be turned off and application processor 2002 can stop its high-speed clocks, placing the microcontroller in stasis, to achieve minimal power use while measurement processor 2000 can continue to acquire and buffer data. When a predetermined number of results are buffered, or a period of time elapses, measurement processor 2000 can wake up application processor 2002. The high-speed clocks are restored on application processor 2002, data can be retrieved from measurement processor 2000, processed and recorded, and the high-speed clocks are suspended again. During battery saver mode, application processor 2002 is in stasis most of the time, only running in short bursts to process recent measurement data. The semi-autonomous running of measurement processor 2000 combined with partial suspension of application processor 2002 can extend battery life.

As shown in FIG. 1, On/Off button 118 can include an LED that can blink to indicate that the multimeter is in battery saver mode. The multimeter can be programmed to beep when battery saver mode ends and/or begins. Battery saver mode can be ended in response to a variety of conditions, such as a user input. Measurement processor 2000 can be a Texas Instruments MSP430, which is an ultra-low-power microcontroller platform. Application processor 2002 can be a Freescale I.MXS MC9328, which is a microcontroller built around an ARM9 core.

CONCLUSION

Any of the features discussed above can be provided in any combination in one multimeter. For example, in some embodiments, the autosave function and the auto-incrementing number function can be used in combination so that the multimeter automatically saves a sequence of stable measurements with auto-incrementing nu number function can be used in combination so that the multimeter automatically saves a sequence of stable measurements with auto-incrementing numbers attached to the name of each measurement in the sequence. In other embodiments, the features may be provided separately.

Many specific details of certain embodiments of the invention are set forth in the description and in the figures to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as a means-plus-function claim under 35 U.S.C sec. 112, other aspects may likewise be embodied as a means-plus-function claim. Accordingly, the inventors reserve the right to add additional claims after filing the application to pursue such additional claim forms for other aspects of the invention.

We claim:

1. A handheld device for detecting electrical or physical parameters comprising:
    a user interface configured to receive an enable command to enable automated saving of sequential stable measurements;
    a measuring circuit configured to measure a physical or electrical parameter; and
    a processor coupled to the measuring circuit and the user interface, and in response to the enable command, the processor is configured to:
        individually and successively display a plurality of measurements, wherein each measurement is displayed upon determining that the measurement is stable and is displayed until a subsequent stable measurement is detected; and
        automatically store the sequential plurality of displayed stable measurements in a memory coupled to the processor.

2. The hand held device of claim 1, wherein:
    the user interface is further configured to receive a disable command to disable automated saving of sequential stable measurements; and
    in response to the disable command, the processor is further configured to discontinue automatically storing a sequential plurality of stable measurements in the memory.

3. The hand held device of claim 1, wherein the processor is adapted to individually and successively display a plurality of stored stable measurements in the order in which the stored stable measurements were taken.

4. The handheld device of claim 3, wherein the processor is adapted to individually and successively display an auto-incrementing number associated with each individually and successively displayed stable measurement.

5. The handheld device of claim 1, wherein the user interface is further configured to receive an identifier to be associated with the collection of saved sequential stable measurements; and the processor is further configured to associate the stored sequential plurality of stable measurements with the identifier.

6. The handheld device of claim 1, wherein the user interface is further configured to receive user-input to replace a previously-saved measurement with a new measurement value, and the processor is further configured to store a new measurement value in the sequence of saved measurements to replace the user-identified previously-saved measurement.

7. A handheld device for detecting electrical or physical parameters comprising:
    a user interface configured to receive:
        (i) a selection to enable automated saving of sequential stable measurements as a measurement collection,
        (ii) an identifier to be associated with the measurement collection
    a measuring circuit configured to measure a user-selected physical or electrical parameter; and
    a processor coupled to the measuring circuit and the user interface, and in response to a user-selection from the user interface to enable automated saving of sequential stable measurements, the processor is configured to:
        automatically store a sequential plurality of stable measurements in a memory coupled to the processor, and
        associate in the memory the identifier with the stored sequential plurality of stable measurements.

* * * * *